(12) United States Patent
Nazarian

(10) Patent No.: US 9,013,911 B2
(45) Date of Patent: Apr. 21, 2015

(54) MEMORY ARRAY ARCHITECTURE WITH TWO-TERMINAL MEMORY CELLS

(75) Inventor: Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 485 days.

(21) Appl. No.: 13/529,985

(22) Filed: Jun. 21, 2012

(65) Prior Publication Data

US 2012/0327701 A1 Dec. 27, 2012

Related U.S. Application Data

(60) Provisional application No. 61/500,547, filed on Jun. 23, 2011.

(51) Int. Cl.
| | |
|---|---|
| *G11C 11/00* | (2006.01) |
| *G11C 11/16* | (2006.01) |
| *H01L 45/00* | (2006.01) |
| *H01L 27/22* | (2006.01) |
| *H01L 27/24* | (2006.01) |
| *G11C 11/56* | (2006.01) |
| *G11C 13/00* | (2006.01) |

(52) U.S. Cl.
CPC ............ *G11C 11/1659* (2013.01); *H01L 45/04* (2013.01); *H01L 45/06* (2013.01); *H01L 45/085* (2013.01); *H01L 45/1233* (2013.01); *H01L 45/1266* (2013.01); *H01L 27/228* (2013.01); *H01L 27/2436* (2013.01); *G11C 11/1653* (2013.01); *G11C 11/5678* (2013.01); *G11C 11/5685* (2013.01); *G11C 13/0004* (2013.01); *G11C 13/0007* (2013.01); *G11C 13/0023* (2013.01); *G11C 13/003* (2013.01); *G11C 13/004* (2013.01); *G11C 13/0061* (2013.01); *G11C 13/0069* (2013.01); *G11C 2013/0071* (2013.01); *G11C 2213/33* (2013.01); *G11C 2213/74* (2013.01); *G11C 2213/79* (2013.01); *G11C 2213/82* (2013.01); *G11C 2213/78* (2013.01)

(58) Field of Classification Search
USPC ................................ 365/148, 129, 145, 163
See application file for complete search history.

(56) References Cited

U.S. PATENT DOCUMENTS

| | | | |
|---|---|---|---|
| 5,499,208 A | 3/1996 | Shoji | |
| 5,673,223 A | 9/1997 | Park | |

(Continued)

FOREIGN PATENT DOCUMENTS

| | | |
|---|---|---|
| EP | 1096465 A2 | 2/2001 |
| KR | 10-2009-00051206 A | 5/2009 |

OTHER PUBLICATIONS

Notice of Allowance for U.S. Appl. No. 12/815,318 dated Nov. 29, 2012.

(Continued)

*Primary Examiner* — Son Dinh
*Assistant Examiner* — Uyen B Tran
(74) *Attorney, Agent, or Firm* — Ogawa P.C.

(57) ABSTRACT

A non-volatile memory device includes a word line extending along a first direction; a bit line extending along a second direction; a memory unit having a read transistor coupled to the bit line, at least one two-terminal memory cell, and a select transistor, the two-terminal memory cell having a first end coupled to the word line and a second end coupled to a gate of the read transistor. The second end of the two-terminal memory cell is coupled to a common node shared by a drain of the select transistor and the gate of the read transistor.

43 Claims, 13 Drawing Sheets

(56) References Cited

U.S. PATENT DOCUMENTS

| | | | |
|---|---|---|---|
| 5,923,587 A | 7/1999 | Choi | |
| 6,002,268 A | 12/1999 | Sasaki et al. | |
| 6,181,587 B1 | 1/2001 | Kuramoto et al. | |
| 6,552,932 B1 * | 4/2003 | Cernea | 365/185.05 |
| 6,731,535 B1 | 5/2004 | Ooishi et al. | |
| 6,867,618 B2 | 3/2005 | Li et al. | |
| 6,897,519 B1 | 5/2005 | Dosluoglu | |
| 7,167,387 B2 | 1/2007 | Sugita et al. | |
| 7,251,152 B2 | 7/2007 | Roehr | |
| 7,274,587 B2 | 9/2007 | Yasuda | |
| 7,345,907 B2 | 3/2008 | Scheuerlein | |
| 7,515,454 B2 | 4/2009 | Symanczyk | |
| 7,561,461 B2 | 7/2009 | Nagai et al. | |
| 7,606,059 B2 | 10/2009 | Toda | |
| 7,692,959 B2 | 4/2010 | Krusin-Elbaum et al. | |
| 7,746,696 B1 | 6/2010 | Paak | |
| 7,764,536 B2 | 7/2010 | Luo et al. | |
| 7,869,253 B2 | 1/2011 | Liaw et al. | |
| 8,054,679 B2 | 11/2011 | Nakai et al. | |
| 8,102,018 B2 | 1/2012 | Bertin et al. | |
| 8,243,542 B2 | 8/2012 | Bae et al. | |
| 8,315,079 B2 | 11/2012 | Kuo et al. | |
| 8,369,129 B2 * | 2/2013 | Fujita et al. | 365/148 |
| 8,456,892 B2 | 6/2013 | Yasuda | |
| 8,467,226 B2 | 6/2013 | Bedeschi et al. | |
| 8,675,384 B2 | 3/2014 | Kuo et al. | |
| 2003/0036238 A1 | 2/2003 | Toet et al. | |
| 2004/0170040 A1 | 9/2004 | Rinerson et al. | |
| 2006/0279979 A1 * | 12/2006 | Lowrey et al. | 365/148 |
| 2007/0133250 A1 | 6/2007 | Kim | |
| 2008/0043521 A1 | 2/2008 | Liaw et al. | |
| 2009/0091981 A1 | 4/2009 | Park et al. | |
| 2009/0251941 A1 | 10/2009 | Saito | |
| 2010/0039136 A1 | 2/2010 | Chua-Eoan et al. | |
| 2010/0067279 A1 | 3/2010 | Choi | |
| 2010/0067282 A1 * | 3/2010 | Liu et al. | 365/148 |
| 2010/0102290 A1 | 4/2010 | Lu et al. | |
| 2010/0110767 A1 | 5/2010 | Katoh et al. | |
| 2010/0171086 A1 | 7/2010 | Lung et al. | |
| 2010/0182821 A1 | 7/2010 | Muraoka et al. | |
| 2011/0063888 A1 | 3/2011 | Chi et al. | |
| 2011/0066878 A1 | 3/2011 | Hosono et al. | |
| 2011/0122679 A1 | 5/2011 | Chen et al. | |
| 2011/0205780 A1 | 8/2011 | Yasuda et al. | |
| 2012/0074507 A1 | 3/2012 | Jo et al. | |
| 2012/0091420 A1 | 4/2012 | Kusai et al. | |
| 2012/0120712 A1 | 5/2012 | Kawai et al. | |
| 2012/0218807 A1 | 8/2012 | Johnson | |
| 2012/0320660 A1 | 12/2012 | Nazarian et al. | |
| 2013/0134379 A1 | 5/2013 | Lu | |
| 2013/0235648 A1 | 9/2013 | Kim et al. | |

OTHER PUBLICATIONS

International Search Report and Written Opinion for PCT/US2012/044077 filed on Jun. 25, 2012.
Office Action for U.S. Appl. No. 13/651,169 dated Mar. 7, 2013.
Office Action for U.S. Appl. No. 13/174,077 dated Apr. 1, 2013.
Office Action for U.S. Appl. No. 13/764,710 dated Aug. 9, 2013.
Notice of Allowance for U.S. Appl. No. 13/481,696 dated Sep. 30, 2013.
International Search Report and Written Opinion for PCT/US2013/042746 filed on May 24, 2013.
Notice of Allowability for U.S. Appl. No. 13/651,169 dated Oct. 28, 2013.
Notice of Allowance for U.S. Appl. No. 13/194,500 dated Oct. 28, 2013.
Office Action for U.S. Appl. No. 13/194,479 dated Sep. 25, 2013.
Liu, Ming et al., "rFGA: CMOS-Nano Hybrid FPGA Using RRAM Components", IEEE International Symposium on Nanoscale Architectures, Jun. 12-13, 2008, pp. 93-98, Anaheim, USA.
Office Action for U.S. Appl. No. 13/531,449, dated Jun. 30, 2014.
Office Action for U.S. Appl. No. 14/166,691, dated Jul. 9, 2014.
Office Action for U.S. Appl. No. 12/900,232 dated Jul. 30, 2012.
Notice of Allowance for U.S. Appl. No. 13/051,296 dated Aug. 31, 2012.
Notice of Allowance for U.S. Appl. No. 12/900,232 dated Sep. 18, 2012.
Office Action for U.S. Appl. No. 13/525,096, dated Dec. 27, 2013.
Office Action for U.S. Appl. No. 12/815,318 dated May 16, 2012.
International Search Report for PCT/US2011/046036 filed on Jul. 29, 2011.
Written Opinion of the International Searching Authority for PCT/US2011/046036 filed on Jul. 29, 2011.

* cited by examiner

MEMORY ARRAY ARCHITECTURE WITH TWO-TERMINAL MEMORY CELLS

CROSS-REFERENCES TO RELATED APPLICATIONS

This application is a non-provisional application of U.S. Provisional Patent Application No. 61/500,547, filed on Jun. 23, 2011 and incorporated by reference in its entirety herein for all purposes.

BACKGROUND

The present invention relates to a memory array architecture including two-terminal memory cells, e.g., resistive memory cells.

A resistive random-access memory (RRAM) is a type of a resistive memory and has generated significant interest recently as a potential candidate for ultra-high density non-volatile information storage. A typical RRAM device has an insulator layer provided between a pair of electrodes and exhibits electrical pulse induced hysteretic resistance switching effects.

The resistance switching has been explained by the formation of conductive filaments inside the insulator layer due to Joule heating and electrochemical processes in binary oxides (e.g. NiO and $TiO_2$) or redox processes for ionic conductors including oxides, chalcogenides, and polymers. The resistance switching has also been explained by field assisted diffusion of ions in $TiO_2$ and amorphous silicon (a-Si) films.

In the case of a-Si structures, electric field-induced diffusion of metal ions into the silicon leads to the formation of conductive filaments that reduce the resistance of the a-Si structure. These filaments remain after a biasing (or program) voltage is removed, thereby giving the device its non-volatile characteristic, and they can be removed by reverse flow of the ions back toward the metal electrode under the motive force of a reverse polarity applied voltage.

Resistive devices based on the a-Si structure, particularly, that formed on polysilicon, typically exhibit good endurance or life cycle. However, the endurance of the resistive device can be shortened if an excessive bias voltage is applied to the device during repeated write and erase cycles in part due to Joule heating and movements of an unnecessarily large number of metal ions in the a-Si structure. Furthermore, in general, RRAM device yield is affected by an electroforming process during which a major part of a conducting path is formed inside a switching medium by applying a larger voltage (or current) signal to the device.

BRIEF SUMMARY OF THE INVENTION

The present invention relates to a memory array architecture including two-terminal memory cells, e.g., resistive memory cells. The memory array includes a plurality of memory units, each including a program/erase transistor, a read transistor, and at least one two-terminal memory cell such as RRAM.

In one embodiment, a non-volatile memory device includes a word line extending along a first direction; a bit line extending along a second direction; and a memory unit having a read transistor coupled to the bit line, at least one two-terminal memory cell, and a select transistor, the two-terminal memory cell having a first end coupled to the word line and a second end coupled to a gate electrode of the read transistor.

In another embodiment, a non-volatile memory device includes a plurality of memory units arranged in an array of rows and columns, the each memory unit having a plurality of resistive memory cells, each resistive memory cell having a first end and a second end. A plurality of word lines extends along a first direction and having a first group of word lines associated with a first row of memory units, a second group of word lines associated with a second row of memory units, and a third group of word lines associated with a third row of memory units. A plurality of bit lines extends along a second direction and having a first bit line associated with a first column of memory units, a second bit line associated with a second column of memory units, and a third bit line associated with a third column of memory units. A plurality of read transistors is provided, each read transistor being associated with one of the memory units and having a drain electrode coupled to one of the bit lines. A plurality of select transistors is provided, each select transistor being associated with one of the memory units. A plurality of select lines have a first select line coupled to gate electrodes of the select transistors associated with the first column of memory units, a second select line coupled to gate electrodes of the select transistors associated the second column of memory units, and a third select line coupled to gate electrodes of the select transistors associated with the third column of memory units. A plurality of source lines have a first source line coupled to source electrodes of select transistors associated with the first row of memory units, a second source line coupled to source electrodes of select transistors associated with the second row of memory units, and a third source line coupled to source electrodes of select transistors associated with the third row of memory units. The first terminals of the resistive memory cells are coupled to the corresponding word lines and the second terminals of the resistive memory cells are coupled to corresponding common nodes, each common node being shared by the drain electrode of one of the select transistor and the gate electrode of the corresponding read transistor.

In another embodiment, a memory unit of a memory device includes a plurality of resistive memory cells; a select transistor having a drain electrode coupled to a common node, a gate electrode coupled to a select line, and a source electrode coupled to a source line; and a read transistor having a drain electrode coupled to a bit line and a gate electrode coupled to the common node. Each resistive memory cell has a first end coupled to a word line and a second end coupled to the common node, and a switching medium provided between the first and second ends.

In yet another embodiment, a method for programming a memory device includes providing a memory unit having a plurality of resistive memory cells, a select transistor having a drain electrode coupled to a common node, a gate electrode coupled to a select line, and a source electrode coupled to a source line, a read transistor having a drain electrode coupled to a bit line and a gate electrode coupled to the common node, wherein each resistive memory cell has a first end coupled to a word line and a second end coupled to the common node, and a switching medium provided between the first and second ends. The method further includes selecting at least one resistive memory cell; and applying a first potential to the word line associated with the selected memory cell with respect to the common node.

In yet another embodiment, the first potential is a positive potential. The method further includes applying the program voltage to the word line associated with the selected memory cell; and applying a select voltage to the gate electrode of the select transistor to turn on the select transistor.

In yet another embodiment, the first potential corresponds to a read voltage sufficient to cause electrical current to flow through the selected resistive memory cell if the selected resistive memory cell is in a low resistive state, the read voltage not being sufficient to change a resistive state of the selected memory cell.

In yet another embodiment, the first potential is a negative potential. The method further includes applying an erase voltage to the source line; applying about 0 volt to the word line associated with the selected memory cell; and applying a select voltage to the gate electrode of the select transistor to turn on the select transistor.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

The present invention relates to a memory array architecture including two-terminal memory cells, e.g., resistive memory cells. The memory array includes a plurality of memory units, each including a program/erase transistor, a read transistor, and at least one two-terminal memory cell. The two-terminal memory cells include RRAM, phase-change memory, magnetoresistive random access memory (MRAM), spin-transfer torque RAM (STT-RAM), and the like.

Figure 1:
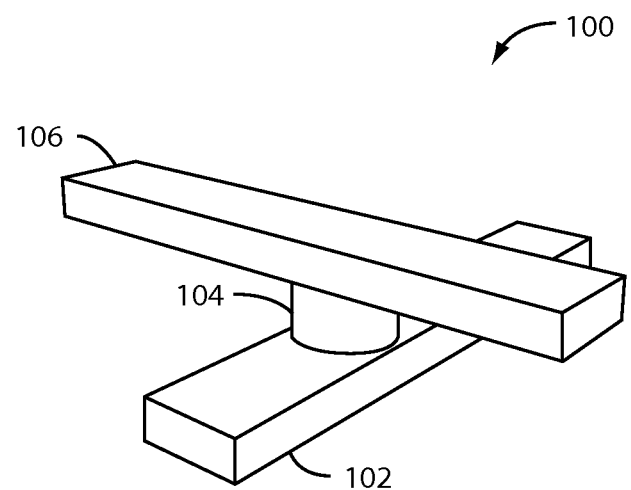
FIG. 1 illustrates a non-volatile memory device including a bottom electrode, a switching medium, and a top electrode according an embodiment of the present invention.

FIG. 1 illustrates a non-volatile memory device 100 including a bottom electrode 102, a switching medium 104, and a top electrode 106 according an embodiment of the present invention. The switching medium 104 exhibits a resistance that can be selectively set to various values, and reset, using appropriate control circuitry. The device 100 is a two-terminal resistive memory device, e.g., a resistive random-access memory (RRAM), in the present embodiment. As will be appreciated by one skilled in art, the device 100 may also be used as other types of devices such as a programmable variable capacitor.

The resistive memory device is a two-terminal device having a switching medium provided between top and bottom electrodes. The resistance of the switching medium can be controlled by applying an electrical signal to the electrodes. The electrical signal may be current-based or voltage-based. As used herein, the term "RRAM" or "resistive memory device" or "resistive memory cell" refers to a memory device that uses a switching medium whose resistance can be controlled by applying an electrical signal without ferroelectricity, magnetization and phase change of the switching medium.

In the present embodiment, the device 100 is an amorphous-silicon-based resistive memory device and uses amorphous silicon (a-Si) as the switching medium 104. The resistance of the switching medium 104 changes according to formation or retrieval of a conductive filament inside the a-Si switching medium 104 according to a voltage applied. The top electrode 106 is a conductive layer containing silver (Ag) and acts as a source of filament-forming ions in the a-Si switching medium 104. Although silver is used in the present embodiment, it will be understood that the top electrode 106 can be formed from various other suitable metals, such as gold (Au), nickel (Ni), aluminum (Al), chromium (Cr), iron (Fe), manganese (Mn), tungsten (W), vanadium (V), and cobalt (Co). The bottom electrode 102 is a boron-doped or other p-type polysilicon electrode that is in contact with a lower end face of the a-Si switching medium 104.

Figure 2A:
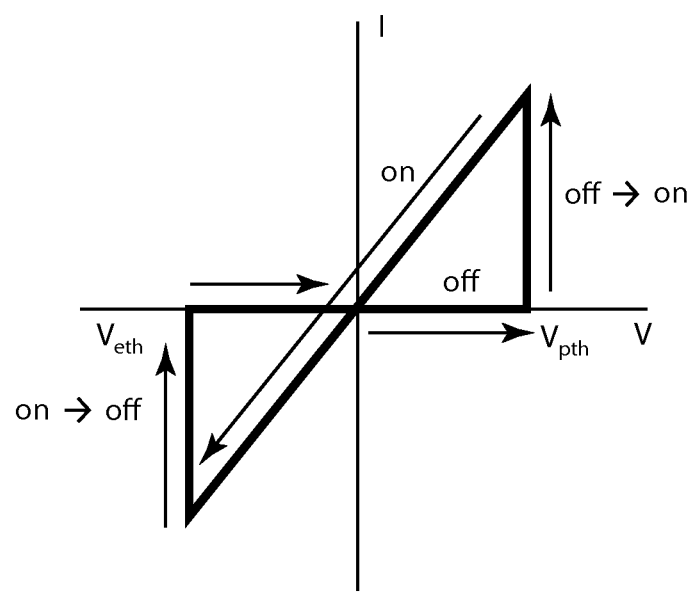
FIG. 2A illustrates resistance switching characteristics of the device according to an embodiment of the present invention.

FIG. 2A illustrates resistance switching characteristics of the device 100 according to an embodiment of the present invention. The switching medium 104 displays a bipolar switching mechanism. The resistance of the switching medium 104 changes depending on the polarity and magnitude of a current signal applied to the switching medium 104 via the top and bottom electrodes 106 and 102. The device 100 is changed into an ON-state (low resistance state) when a positive voltage equal to or greater than a program threshold voltage (or program voltage) Vpth is applied. In an embodiment, the program voltage ranges between 1 volt to 5 volts depending on the materials used for the switching medium 104 and the top electrode 106. The device 100 is switched back to an OFF-state (high resistance state) when a negative voltage equal to or greater than an erase threshold voltage (or erase voltage) Veth is applied. In an embodiment, the erase voltage ranges from −1 volts to −5 volts. The device state is not affected if the voltage applied is between the two threshold voltages Vpth and Veth, which enables a low-voltage, read process. Once the device 100 is set to a specific resistance state, the device 100 retains information for a certain period (or retention time) without electrical power.

FIG. 2A illustrates non-rectifying switching characteristics of the device 100 according to an embodiment of the present invention. Electrical current flows from the top electrode 106 to the bottom electrode 102 when the top electrode 106 is applied with a positive potential with respect to the bottom electrode 102. On the other hand, the current flows in a reverse direction if the top electrode 106 is applied with a negative potential with respect to the bottom electrode 102.

Figure 2B:
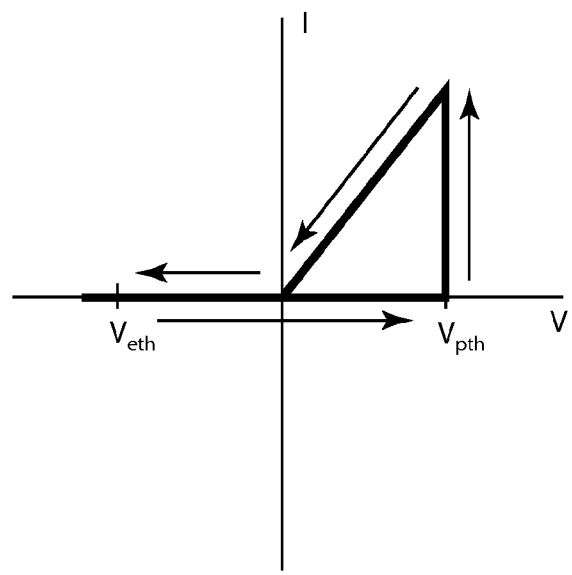
FIG. 2B illustrates resistance switching characteristics of the device according to an embodiment of the present invention.

FIG. 2B, on the other hand, illustrates rectifying switching characteristics of the device 100 according to another embodiment of the present invention. Electrical current flows from the top electrode 106 to the bottom electrode 102 when the top electrode 106 is applied with a positive potential with respect to the bottom electrode 102, but the current does not flow in the reverse direction even if the top electrode 106 is applied with a negative potential with respect to the bottom electrode 102. Under this embodiment, the device 100 exhibits a diode-like behavior and can be represented with an equivalent circuit including a resistor connected in series with a diode. The device 100 can be controlled to exhibit either rectifying or non-rectifying characteristics by controlling the amount of current flowing through the device as will be explained in more detail later.

Figure 3A:
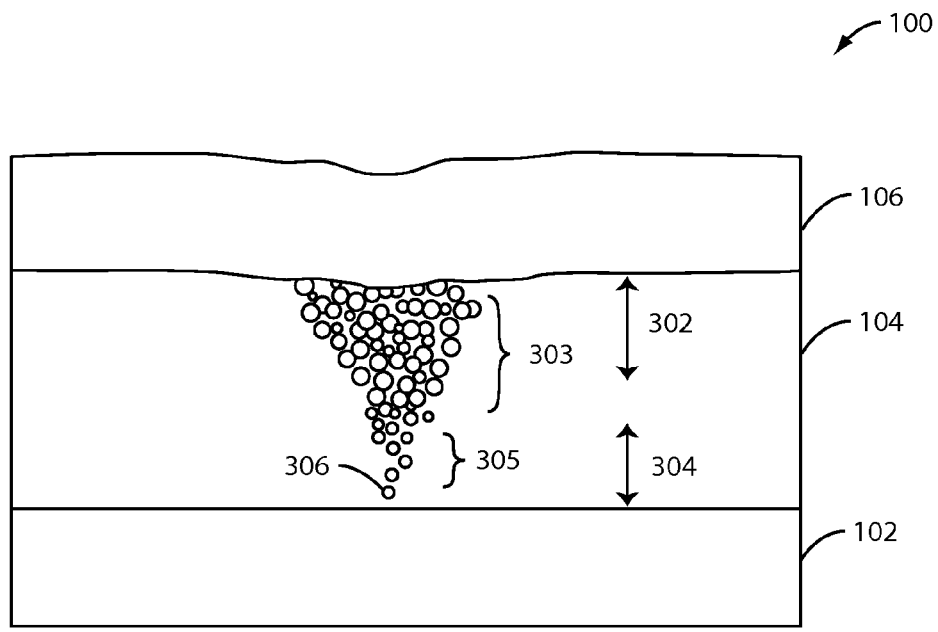
FIG. 3A illustrates a two-terminal device that is placed in an ON state by applying a program voltage Vpth to the top electrode.
Figure 3B:
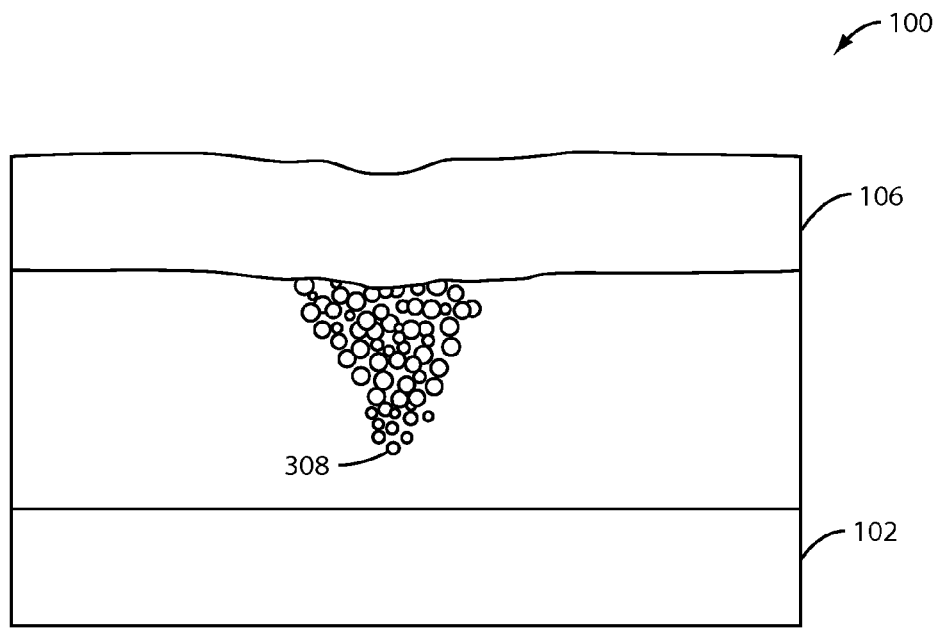
FIG. 3B illustrates a two-terminal device that is placed in an OFF state by applying an erase voltage Veth to the top electrode.

FIGS. 3A and 3B illustrate a switching mechanism of the device 100 during the ON and OFF states according to an embodiment of the present invention. The switching in the a-Si switching medium 104 is based on formation and retrieval of a conductive filament or a plurality of filaments in a filament region in the a-Si switching medium 104 according to the program and erase voltages applied to the electrodes 102 and 106 of the device 100.

FIG. 3A illustrates the device 100 that is placed in the ON state (or programmed state) by applying the program voltage Vpth to the top electrode 106. The switching medium 104 made of a-Si is provided between the bottom electrode 102 and the top electrode 106. An upper portion of the switching medium 104 includes a metallic region (or conductive path) 302 that extends from the top electrode 106 to about 10 nm above the bottom electrode 102. The metallic region 302 is formed during an electroforming process when a slightly larger voltage than a subsequent switching voltage, e.g., 1~5 V, is applied to the top electrode 106. This large voltage causes the electric field induced diffusion of the metal ions from the top electrode 106 toward the bottom electrode 102, thereby forming a continuous conductive path 303. A lower portion of the switching medium 104 defines a filament region 304 wherein a filament 305 is formed when the program voltage Vpth is applied after the electroforming process. The regions 303 and 305 can be also formed together during the electroforming process. The filament 305 includes a series of metal particles that are trapped in defect sites in the lower portion of the switching medium 104 when the program voltage Vpth applied provides sufficient activation energy to push a number of metal ions from the metallic region 302 toward the bottom electrode 102.

The filament 305 is believed to be comprised of a collection of metal particles that are separated from each other by the non-conducting switching medium and does not define a continuous conductive path, unlike the path 303 in the metallic region 302. The filament 305 extends about 2-10 nm depending on implementation. The conduction mechanism in the ON state is electrons tunneling through the metal particles in the filament 305. The device resistance is dominated by the tunneling resistance between a metal particle 306 and the bottom electrode 102. The metal particle 306 is a metal particle in the filament region 304 that is closest to the bottom electrode 102 and is the last metal particle in the filament region 304 in the ON state.

FIG. 3B illustrates the device 100 that is placed in an OFF state (or erased state) by applying the erase voltage Veth to the top electrode 106. The erase voltage Veth exerts a sufficient electromagnetic force to dislodge the metal particles trapped in the defect sites of the a-Si and retrieves at least part of the filament 305 from the filament region 304. A metal particle 308 that is closest to the bottom electrode 102 in the OFF state is separated from the bottom electrode 102 by a distance greater than the metal particle 306 during the ON state. This increased distance between the metal particle 308 and the bottom electrode 102 places the device 100 in a high resistance state compared to the ON state. In an embodiment, a resistance ratio between the ON/OFF states ranges from 10E3 to 10E7. The device 100 behaves like a resistor in the ON state and a capacitor in the OFF state. That is, the switching medium 104 does not conduct current in any meaningful amount and behaves basically as a dielectric in the OFF state. In an implementation, the resistance is 10E5 Ohm in the ON state and 10E10 Ohm in the OFF state. In another implementation, the resistance is 10E4 Ohm in the ON state and 10E9 Ohm in the OFF state. In yet another implementation, the resistance is at least 10E7 Ohm in the OFF state.

Referring back to FIGS. 2A and 2B, the device 100 can be controlled to exhibit a diode-like behavior by controlling the amount of current flowing through the device 100. If the amount of current flowing through the device 100 is less than a threshold amount, the device 100 exhibits a diode-like behavior, thereby preventing a reverse current flow from the bottom electrode 102 to the top electrode 106. In an embodiment, the threshold current is 10 μA so that the device 100 exhibits non-rectifying characteristics (see FIG. 2A) if the amount of current is 10 μA or more and rectifying characteristics (see FIG. 2B) if the amount of current is less than 10 μA. The threshold current varies according to the device implementation, e.g., the materials used and the size of the device 100.

It is believed that a negative potential applied to the bottom electrode 102 causes the metal particle 306 closest to the bottom electrode 102 (see FIG. 3A) to shift slightly upward without dislodging it from the filament region 304. The resulting increased distance between the metal particle 306 and the bottom electrode 102 increases the resistance and prevents the current from flowing from the bottom electrode 102 to the metal particle 306. If the current, however, is equal to or greater than the threshold level, the large current bursts through the metal particle 306 from the bottom electrode 102.

Figure 4:
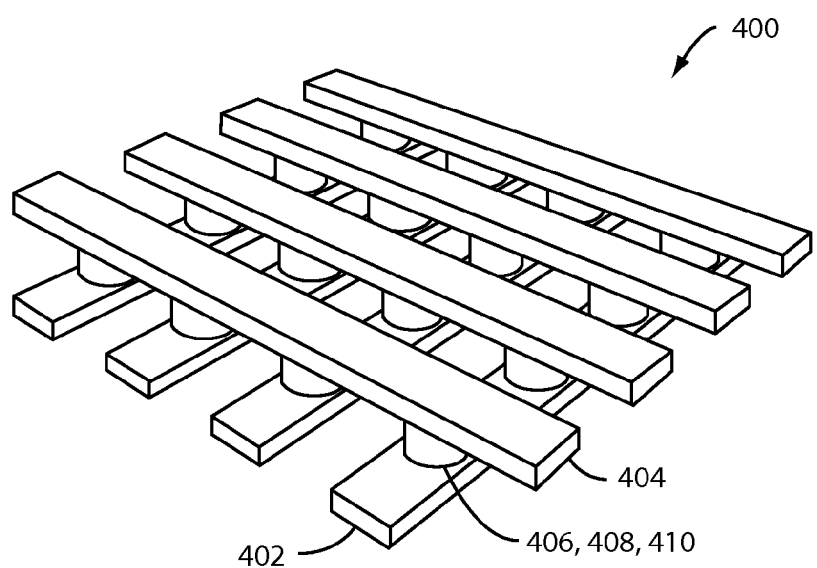
FIG. 4 illustrates a non-crystalline or amorphous silicon (a-Si) based crossbar memory array according to an embodiment of the present invention.

FIG. 4 illustrates a non-crystalline or a-Si based crossbar memory array 400 according to an embodiment of the present invention. The crossbar memory array 400 includes a parallel array of bottom electrodes 402 extending along a first direction. In an embodiment, the bottom electrodes 402 include a bottom metal (not shown) and a p-type polysilicon (not shown) formed on the bottom metal. The bottom electrodes 402 are nanoscale in the present embodiment. For example, the bottom electrodes 402 have a width of about 40 nm and a pitch of about 60 nm.

A parallel array of top electrodes 404 extends along a second direction to intersect the bottom electrodes 402. The top electrodes 404 include metals capable of supplying filament-forming ions such as silver (Ag), gold (Au), nickel (Ni), aluminum (Al), chromium (Cr), iron (Fe), manganese (Mn), tungsten (W), vanadium (V) and cobalt (Co). In an embodiment, the top electrodes 404 and the bottom electrodes 402 are orthogonal to each other. The top electrodes 404 are nanowires having a width of about 60 nm and a pitch of about 150 nm.

Each intersection 406 of the two arrays 402 and 404 defines a two-terminal resistive memory cell 408. The memory cell 408 at each intersection 406 includes two electrodes 402 and 404 separated by a switching layer 410. The switching layer or structure can have a width substantially the same as or narrower than that of the bottom electrode 402. In some embodiments, each memory cell in a crossbar memory array can store a single bit. In other embodiments, the memory cells exhibit multi-level resistance thereby allowing storage of a plurality of bits at each cell.

In the present embodiment, the switching layer 410 includes amorphous silicon or other non-crystalline silicon. As used herein, the term "amorphous silicon" refers to silicon material that is in substantially amorphous phase and may include small grains of crystalline silicon. As used herein, the term "non-crystalline silicon" refers to amorphous silicon or amorphous polysilicon that exhibits controllable resistance, a combination thereof, or the like.

The crossbar memory array as described above may be fabricated on a silicon substrate in an embodiment. In another embodiment, III-V type semiconductor compounds (such as gallium arsenide (GaAs), gallium nitride (GaN), boron nitride (BN), etc.) or II-VI type semiconductor compounds (such as cadmium selenide, zinc telluride, etc.) may also be used as the substrate.

Figure 5:
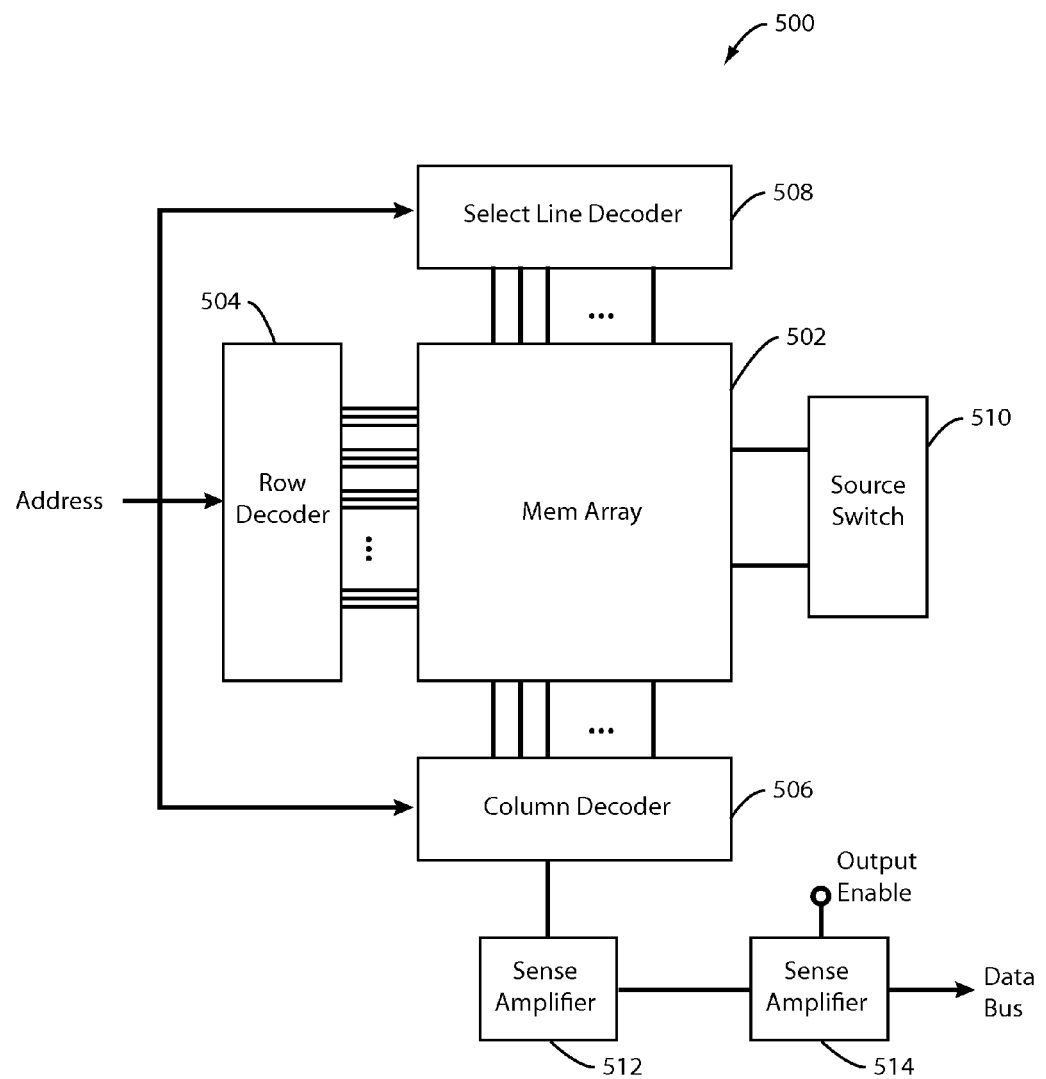
FIG. 5 illustrates a block diagram of a non-volatile memory device according to an embodiment of the present invention.

FIG. 5 illustrates a block diagram of a non-volatile solid state resistive switching device 500 according to an embodiment of the present invention. The device 500 includes a memory array 502 including a plurality of memory units. Each memory unit includes a plurality of resistive memory cells. In the present embodiment, the resistive memory cells are in a NOR configuration where each resistive memory cell can be accessed independently from other resistive memory cells in the same memory unit. In other embodiment, the resistive memory cells may be in a NAND, crossbar, or other configuration. A row decoder 504 receives the address of a resistive memory cell to be operated on and selects a word line associated with the resistive memory cell. A column decoder 506 receives the address of the resistive memory cell for an operation and selects a bit line associated with the resistive memory cell. A select line decoder 508 receives the address of the resistive memory cell and selects a select line associated with a memory unit including the resistive memory cell. A source switch 510 applies a voltage suitable for an operation to be performed on a source line of the memory unit. A sense amplifier 512 senses the current flowing through the bit line selected to determine whether or not a selected resistive memory cell of the memory unit has been programmed or erased. An output buffer 514 receives data sensed by the sense amplifier 512 and outputs the data to a data bus according to an output enable signal.

Figure 6:
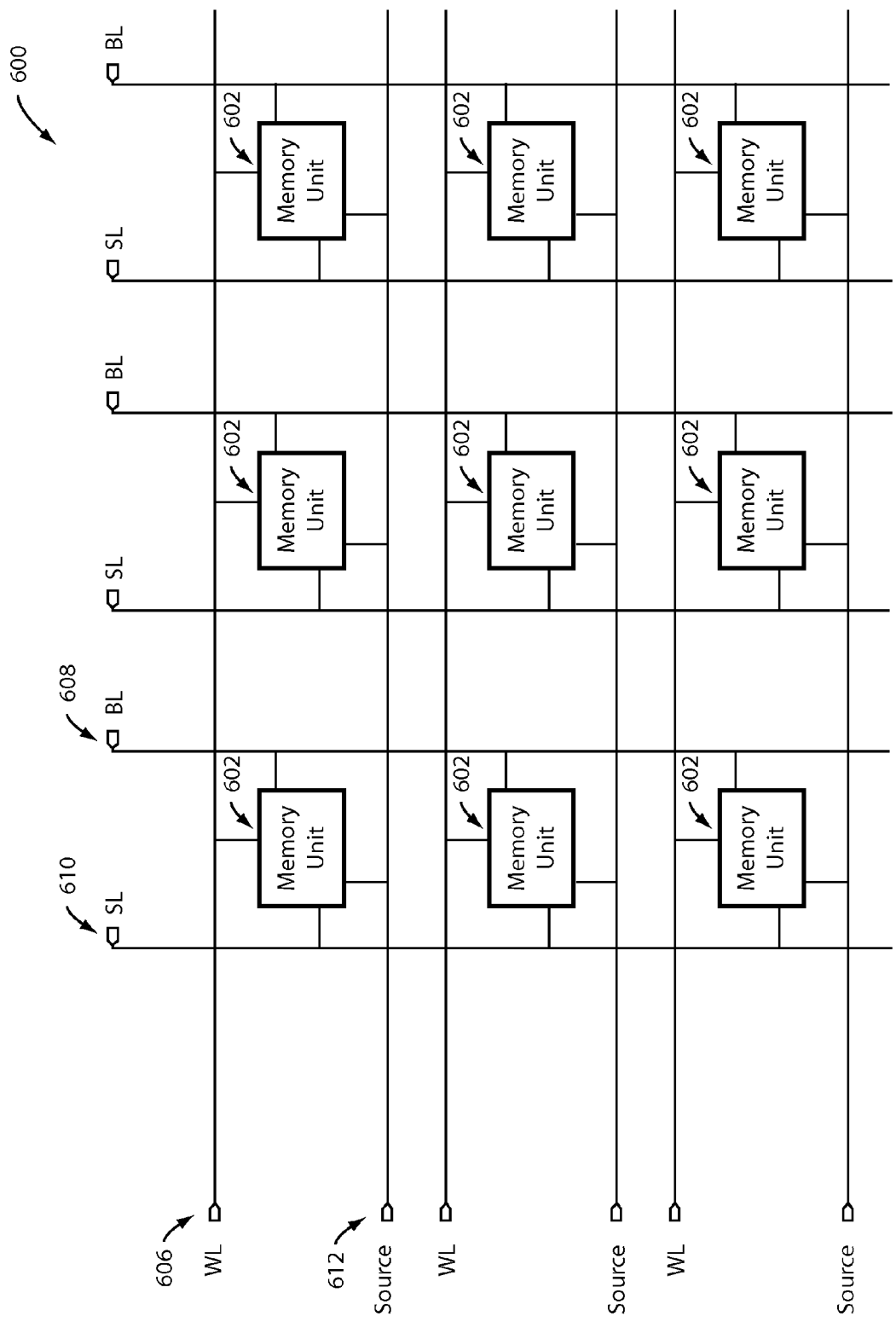
FIG. 6 illustrates a memory array including a plurality of memory units according to an embodiment of the present invention.

FIG. 6 illustrates a memory array 600 including a plurality of memory units 602 according to an embodiment of the present invention. Each memory unit 602 is uniquely identified by a word line 606, a bit line 608, and a select line 610. A source line 612 provides voltages suitable for performing a given operation. The source line 612 is not needed to identify the memory unit 602 in the present embodiment. In other embodiment, the source line 612 may be used to identify a specific memory unit 602.

Each memory unit 602 includes at least one resistive memory cells (See FIG. 7) for storing information. The resistive memory cell stores one or more bits depending on implementation. Each resistive memory cell is coupled to the word line 606. Although only one word line 606 is illustrated for each memory unit 602 in FIG. 6, any number of word lines may be provided for the memory unit 602 according to implementation. In an embodiment, each memory unit 602 has twelve (12) resistive memory cells and twelve (12) word lines associated thereto. In another embodiment, each memory unit 602 has thirty-two (32) resistive memory cells and thirty-two (32) word lines associated thereto. In yet another embodiment, each memory unit 602 has sixty-four (64) resistive memory cells and sixty-four (64) word lines associated thereto.

Figure 7:
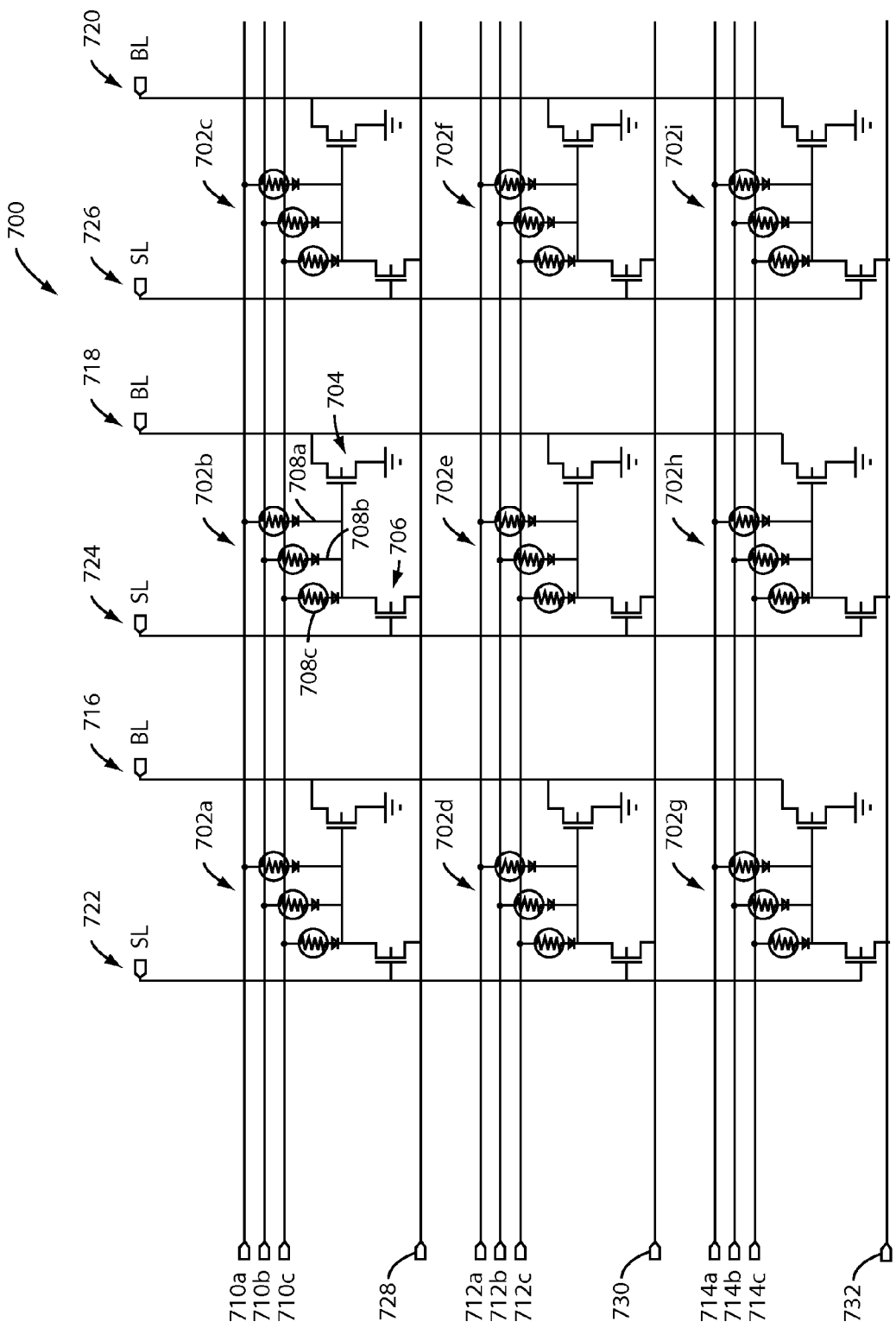
FIG. 7 illustrates a memory array including a plurality of memory units where each memory unit includes a read transistor, a plurality of resistive memory cells, and a select transistor according to an embodiment of the present invention.

FIG. 7 illustrates a memory array 700 including a plurality of memory units 702a-702i that are arranged an array of rows and columns according to an embodiment of the present invention. Each memory unit includes a read transistor 704, a program/erase transistor 706 (also referred to as a "select transistor"), and a plurality of resistive memory cells 708a, 708b, and 708c for storing data. Since data are stored in the resistive memory cells, the read transistor 704 is not required to be scaled down to a nano scale in order to provide the requisite device density, unlike those memory devices that use transistors to store data, e.g., Flash and DRAM memory devices.

A gate electrode of the read transistor 704 and a drain electrode of the program/erase transistor 706 share a common node. Bottom electrodes of the resistive memory cells 708a, 708b, and 708c are coupled to this common node connecting the gate electrode of the read transistor 704 and the drain electrode of the program/erase transistor 706. Each resistive memory cell in a memory unit may be programmed, erased, or read independently from other memory cells in the same memory unit. For illustrative convenience, only three resistive memory cells 708a, 708b, and 708c are shown for each memory unit, but their number can vary according to implementation.

In the present embodiment, the resistive memory cells 708a, 708b, and 708c are operated to exhibit diode-like characteristics so that an electrical current flows from the top electrode (e.g., the word line) to the bottom electrode (e.g., the common node connected to the gate electrode of the read transistor). Each resistive memory cell, therefore, exhibits characteristics of a resistor connected in series with a diode. This unidirectional current flow prevents problems associated with a sneak-path current without using an external diode that would require greater device fabrication complexity and larger device real estate.

Referring back to FIG. 7, the memory array 700 has word lines that are grouped according to the rows of memory units. A plurality of first word lines 710a, 710b, and 710c are associated with the memory units 702a, 702b, and 702c in a first row. Each of the first word lines is connected to the top electrode of one of memory cells of each memory unit in the first row. For example, the first word lines 710a, 710b, and 710c are connected to the resistive memory cells 708a, 708b, and 708c of the memory unit 702b, respectively. A plurality of second word lines 712a, 712b, and 712c are associated with the memory units 702d, 702e, and 702f in a second row. Each of the second word lines is connected to the top electrode of one of memory cells of each memory unit in the second row. A plurality of third word lines 714a, 714b, and 714c are associated with the memory units 702g, 702h, and 702i in a third row. Each of the third word lines is connected to the top electrode of one of memory cells of each memory unit in the third row.

In an embodiment, each group of word lines has the same number of word lines as the number of memory cells in a memory unit. For example, each group of word lines may have eight (8) word lines, sixteen (16) word lines, thirty-two (32) word lines, or sixty-four (64) word lines according to the number of memory cells provided in each memory unit. Depending on implementation, a page of data may be defined by each word line, each memory unit, or each row of memory units.

A first bit line 716 is connected to drains of read transistors of the memory units 702a, 702d, and 702g in a first column. A second bit line 718 is connected to drains of read transistors of the memory units 702b, 702e, and 702h in a second column. A third bit line 720 is connected to drains of read transistors of the memory units 702c, 702f, and 702i in a third column.

A first select line 722 is connected to gates of program/erase transistors of the memory units 702a, 702d, and 702g in a first column. A second select line 724 is connected to gates of program/erase transistors of the memory units 702b, 702e, and 702h in a second column. A third select line 726 is connected to gates of program/erase transistors of the memory units 702c, 702f, and 702i in a third column. In the present embodiment, a memory unit is selected for an operation by selecting a word line, a bit line, and a select line associated thereto.

A first source line 728 is connected to sources of program/erase transistors of the memory units 702a, 702b, and 702c in the first row. A second source line 730 is connected to sources of program/erase transistors of the memory units 702d, 702e, and 702f in the second row. A third source line 732 is connected to sources of program/erase transistors of the memory units 702g, 702h, and 702i in the third row. In the present embodiment, the source lines provide appropriate voltages to the program/erase transistors according to an operation to be performed on a selected resistive memory cell. In an embodiment, each memory unit is associated with at least one word line, a bit line, and a select line. In an embodiment, each memory unit has eight (8) memory cells and is associated with eight (8) word lines. In another embodiment, each memory unit has sixteen (16) memory cells and is associated with sixteen (16) word lines. In another embodiment, each memory unit has thirty-two (32) memory cells and is associated with thirty-two (32) word lines.

In operations, a resistive memory cell is operated, e.g., programmed, erased, or read, by applying predetermined voltages to word lines, bit lines, select lines, and source lines of the memory array 700 according to an operation to be performed. The memory array 700 reads fast since the resistive memory cells are provided between the word lines and the gate of the read transistor instead of in the path of the bit lines. Below is an operation table according to an embodiment of the present invention.

TABLE 1

| Operation | WL Selected | WL Unselected | Source Line | Select Line | BL Selected |
|---|---|---|---|---|---|
| Program | ~3 V (pulse) | 1.5 V or Float | 0 V | 3 V | Float or 0 V |
| Erase | 0 V | Float or 4 V | 4 V | 4 V | Float or 0 V |
| Read | ~1.5 V (pulse) | Float or 0 V | 0 V | 0 V or Vref | Sense current or voltage |

The memory unit 702b is taken as an example, and the resistive memory cell 708a in the memory unit 702b is selected for programming. A select voltage is applied to the select line 724 and thus to the gate of the program transistor (or select transistor) 706. The channel region of the program transistor 706 becomes conductive. A first voltage (or the program voltage Vpth) is applied to the word line 710a connected to the resistive memory cell 708a by providing a potential difference between the word line 710a and the source line 728 connected to the source of the program transistor 706. A second voltage is applied to the word lines 710b and 710c that are connected to the unselected memory cells 708b and 708c.

In an embodiment, to program a cell, the first voltage of about 3 volts is applied to the word line 710a while the source line 728 is grounded. In another embodiment, the first voltage of about 1 volt is applied to the word line 710a while the source line 728 is grounded. The first voltage may be applied as voltage pulses. The second voltage having amplitude of no more than about half of that of the first voltage is applied to the word lines 710b and 710c. Alternatively, word lines associated with the unselected resistive memory cells can be maintained at float depending on the implementation. For amorphous silicon as the resistive switching material, the first voltage can range from about 0.5 volt to about 5 volts depending on the device dimension and process conditions of the amorphous silicon material, among others.

To erase a programmed cell, an erase voltage Veth having a polarity opposite to that of the program voltage Vpth is applied to programmed cell. The erase voltage Veth has amplitude that is about the same as or slightly greater than the program voltage Vpth.

The resistive memory cell 708a is taken as an example again. The erase voltage Veth (e.g., 4 volts) is applied between the source line 728 and the word line 710a by applying a positive voltage to the source line 728 while the word line 710a is maintained at about 0 volt. The select voltage is applied to the select line 724 to turn on the program transistor 706.

In an embodiment, the read transistor 704 is kept turned off during the program or erase operation since the bit line is used to read data. Bit line 718 is maintained at float or 0 volt.

A read operation is performed to determine a state of a resistive memory cell. The bit line 718 is used to measure the current flow through the selected resistive memory cell 708a. The resistance state of the selected memory cell 708a is determined based on this current flow amount.

During read operation, a read voltage is applied to the word line 710a to provide a potential difference between the word line 710a and the source line 728. In an embodiment, the read voltage has amplitude that is about half of that of the program voltage Vpth in order to prevent the read voltage from disturbing the resistive state of the memory cell being read. In an embodiment, the read voltage is 0.5 to 1.5 volt and is applied as voltage pulses. A voltage (e.g., 0.5 volt) is applied to the word lines 710b and 710c, which are associated with the unselected cells 708b and 708c. The voltage applied to the word lines 710b and 710c may vary according to implementation.

Figure 8:
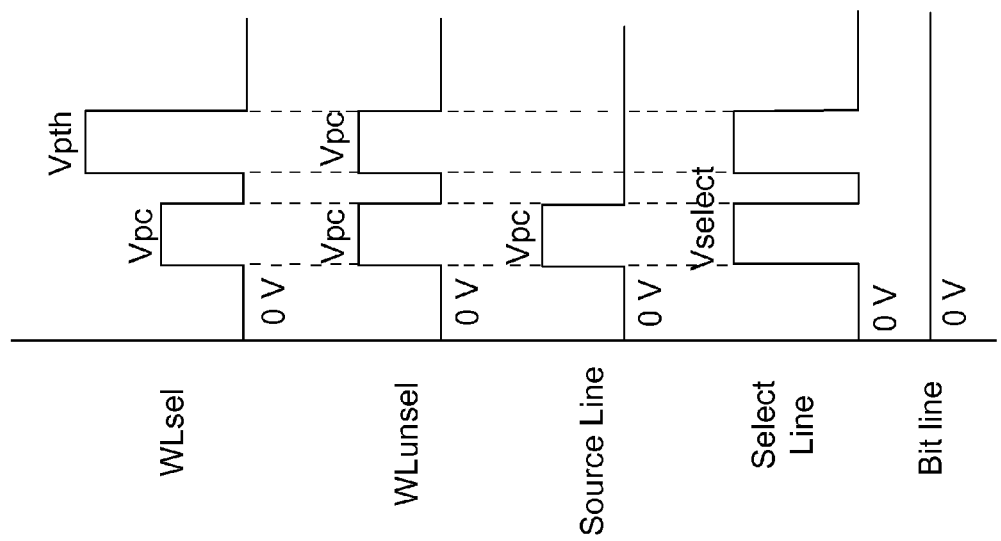
FIG. 8 illustrates a program operation of a memory device according to an embodiment of the present invention.

FIG. 8 illustrates a program operation of a memory device according to an embodiment of the present invention. Since memory cells are interconnected extensively, a leakage current can affect neighboring cells during a program, erase, or read operation. Accordingly, in an embodiment, a precharge operation is performed on the resistive memory cells before the program operation is performed. The precharge operation causes first and second terminals of each of the resistive memory cells in the same row to have substantially the same potential before the program operation. For example, if the resistive memory cell 708a in the memory unit 702b is selected for the programming, a precharge operation is performed to cause the first and second terminals of the resistive memory cells 708a, 708b, and 708c in the memory unit 702b to have a zero potential difference. The precharge operation includes applying a precharge voltage Vpc (or a first precharge voltage) to a selected word line WLsel, e.g., the word line 710a associated with the selected resistive memory cell 708a. The precharge voltage Vpc is also applied to unselected word lines WLunsel, e.g., the word lines 710b and 710c, that are in the same word line group and are associated with the memory units in the first row. Additionally, the precharge voltage Vpc (or second precharge voltage) is applied to the source line 728. In an embodiment, the first precharge voltage applied to the word lines WLsel and WLunsel and the second precharge voltage applied to the source line 728 are substantially the same. In other embodiments, the first and second precharge voltages may be different.

During the precharge operation, the second word lines 712a-712c and the third word lines 714a-714c that are associated with the memory units in the second row and the third row, respectively, are maintained at zero volt or float. The precharge voltage Vpc has amplitude that is less than the program voltage Vpth so as not unintentionally program the memory cells during the precharge operation. In an embodiment, the amplitude of precharge voltage Vpc is no more than about half of that of the program voltage. A voltage Vselect is applied to the select line 724 to turn on the program transistor 706 when the precharge voltage Vpc is applied to the word lines 710a, 710b, and 710c and the source line 728. As a result, the resistive memory cells 708a, 708b, and 708c in the memory unit 702b are at a precharged state.

Thereafter, the program voltage Vpth is applied to the word line 710a connected to the memory cell 708a in order to program it. The precharge voltage Vpc is no longer applied to the source line 728 and a voltage level of the source line 728 is reduced to a zero volt. The precharge voltage Vpc as is continued to be applied to the word lines 710b and 710c of the unselected resistive memory cells 708b and 708c. This precharge voltage Vpc (or inhibit voltage) is applied to inhibit the memory cells 708b and 708c from unintentionally be programmed by the program voltage Vpth applied to the selected resistive memory cell 708a.

Figure 9:
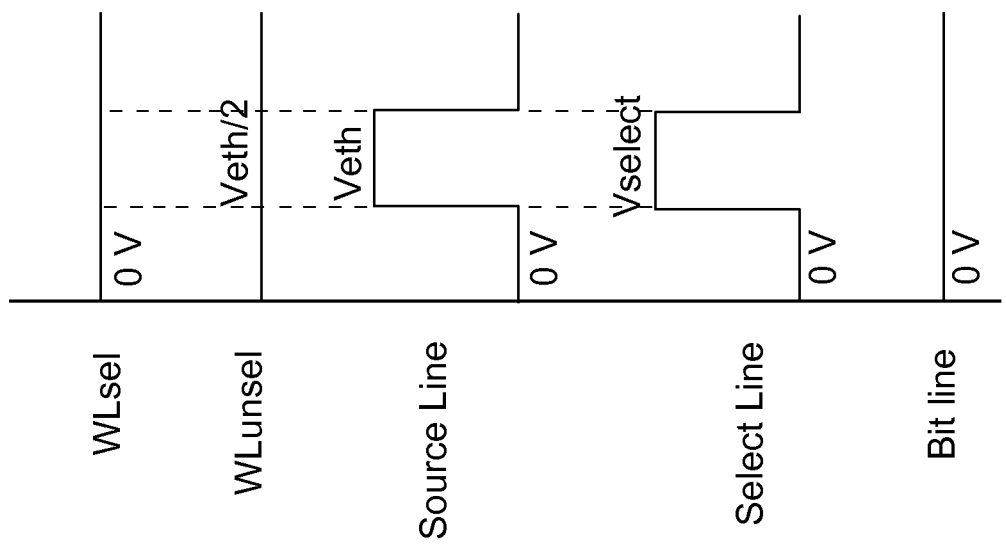
FIG. 9 illustrates a bit erase operation of a memory device according to an embodiment of the present invention.

FIG. 9 illustrates a bit erase operation of a memory device according to an embodiment of the present invention. The resistive memory cell 708a is taken as an example of a programmed cell. An erase voltage Veth is applied to the source line 728 while a zero volt is applied to a selected word line WLsel, e.g., the word line 710a associated with the selected resistive memory cell 708a. A select voltage Vselect applied to the select line 724 to turn on the program transistor 706. The negative potential difference between the word line 710a and the source line 728 cause the memory cell 710a to be erased, i.e., placed at a high resistive state. A voltage, e.g., about Veth/2, is applied to unselected word lines WLunsel, i.e., the word lines 710b and 710c associated with the unselected cells 708b and 708c to prevent the unselected resistive memory cells 708b and 708c from being erased unintentionally. In an embodiment, the select voltage Vselect is applied as voltage pulses.

Figure 10:
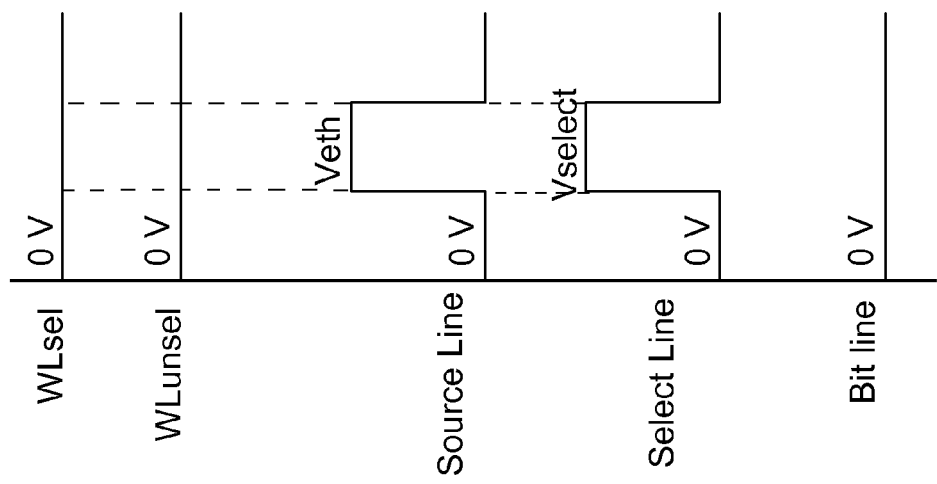
FIG. 10 illustrates a page erase operation of a memory device according to an embodiment of the present invention.

FIG. 10 illustrates a page erase operation of a memory device according to another embodiment of the present invention. The erase operation may be performed on a single cell, for example, the resistive memory cell 708a, as described above with reference to FIG. 9 or on a plurality of selected cells in a same row or a page, as illustrated in FIG. 10. In the present embodiment, the page is defined as all the memory cells of the memory units in the same row.

In a page erase operation, all the memory cells in the memory units 702a, 702b, and 702c are erased at the same time. A zero volt is applied to all the word lines WLsel in the same row, i.e., the first word lines 710a, 710b, and 710c. A source voltage equivalent to the erase voltage Veth is applied to the source line 728. A select voltage Vselect is applied to the select lines 722, 724, and 726, in order to turn on the program/erase transistors of the memory units 702a, 702b, and 702c. All the memory cells of the memory units in the same row are erased at the same time since all of them are applied with the erase voltage. At this time, a zero voltage is applied to the bit lines 716, 718, and 720. Alternatively, the bit lines 716, 718, and 720 may be maintained at float.

In an embodiment, a page may be defined as all the memory cells of a single memory unit. The page erase operation is performed in a similar manner as in FIG. 10, one difference being that the select voltage Vselect is only applied to the select line associated with the memory unit to be erased. In another embodiment, a page is defined as all the memory cells connected to the same word line. The page erase operation can be performed in a similar manner as in FIG. 10, one difference being that the unselected word lines (e.g., 710b and 710c) of the same group are applied with an inhibit voltage, e.g., 1.5 volt, to prevent the memory cells connected to these unselected word lines from being erased.

Figure 11:
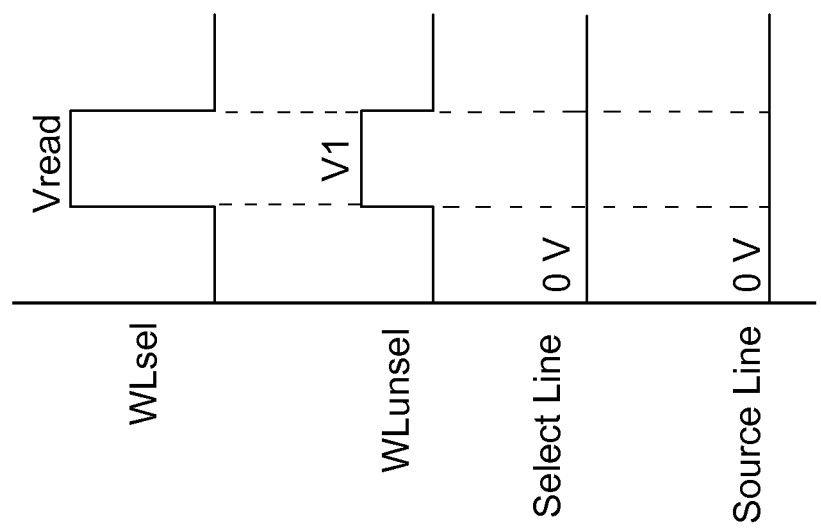
FIG. 11 illustrates a read operation of a memory device according to an embodiment of the present invention.
Figure 12:
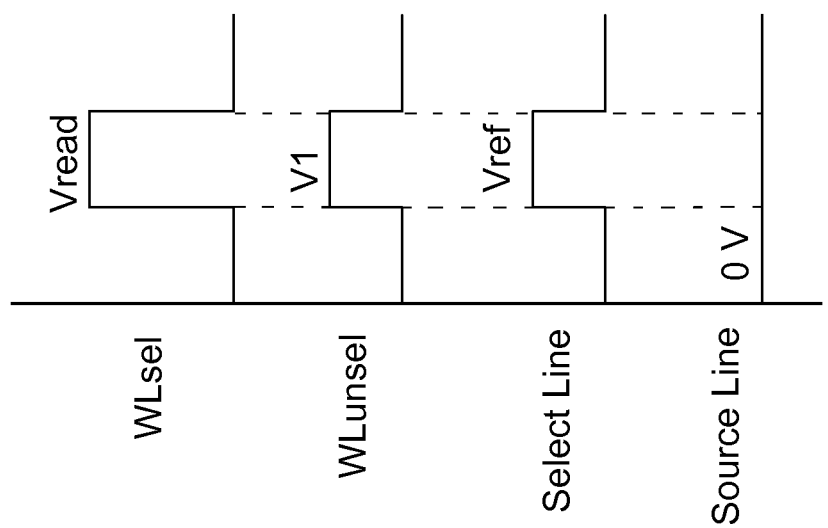
FIG. 12 illustrates a read operation of a memory device according to another embodiment of the present invention.
Figure 13:
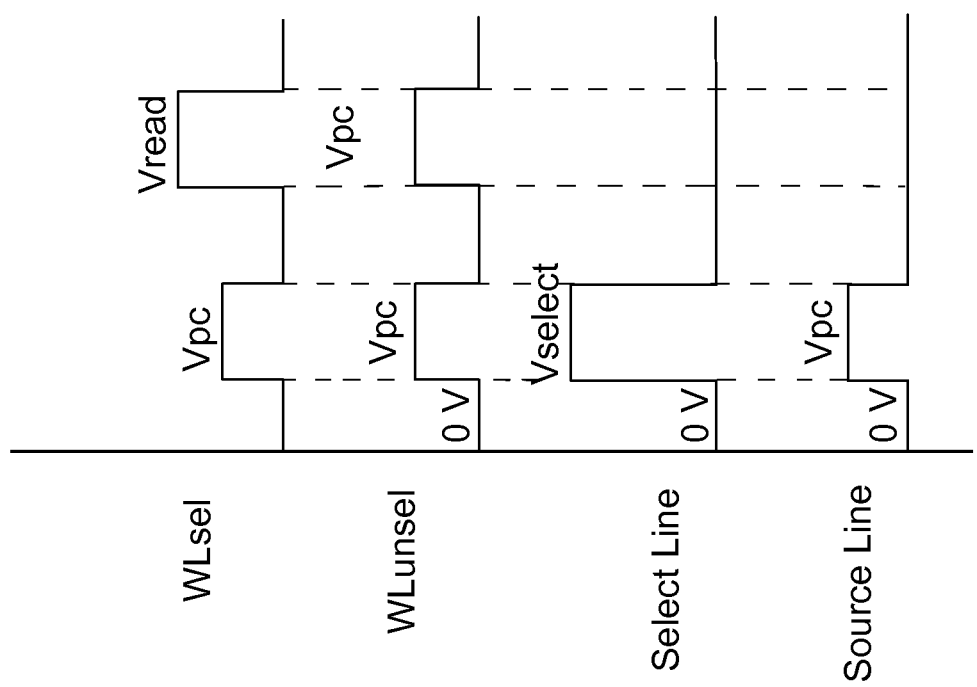
FIG. 13 illustrates a read operation of a memory device according to another embodiment of the present invention.

FIGS. 11, 12, and 13 illustrate various ways to implement a read operation to determine the bit value of a resistive memory cell according to embodiments of the present invention. As memory cells in a memory array are interconnected using a bottom electrode and a top electrode as illustrated in FIG. 4, a read voltage applied to a selected cell should not inadvertently erase or program the memory cells. The read operation may be implemented with or without pre-charging the selected word lines or the selected source line. In the examples herein, the memory cell 708a of the memory unit 702b is assumed to have been selected for the read operation (see FIG. 7).

In an embodiment, no precharge voltage is applied before the read operation is performed on the memory cell 708a (see FIG. 11). A voltage V1, which is no more than the read voltage Vread, is applied to word lines WLunsel, i.e., the word lines 710b and 710c, associated with the unselected memory cells 708b and 708c in the memory unit 702b. A read voltage Vread is applied to a selected word line WLsel, i.e., the word line 710a, connected to the selected memory cell 708a while maintaining the source line 728 at a zero volt to. The read voltage Vread is selected to have amplitude (e.g., 0.5-1.5 volt) that would not inadvertently program or erase the resistive memory cell 708a. In an embodiment, the amplitude of the read voltage Vread is no more than half of that of the program voltage Vpth.

The potential difference caused by the read voltage Vread between the word line 710a and the source line 728 causes a current to flow through the selected memory cell 708a if it is in a programmed state (or low resistance state). This current (or the read voltage), in turn, turns on the read transistor 704 and causes current to flow through the read transistor 704, which would be sensed by a load or a sense circuitry (not shown) coupled to the bit line 718. The sense circuitry may be a current sensor or a voltage sensor according to implementation.

On the other hand, if the memory cell 708a is in an erased state (or high resistance state), little or no current would flow through the memory cell 708a even if the read voltage Vread is applied to the word line 710a. The read transistor 704 would remain turned off and the sense circuitry would not sense a necessary amount of current flow.

FIG. 12 illustrates a read operation according to another embodiment of the present invention. A reference voltage Vref is applied to the select line 724 allowing the program transistor 706 to be conductive during a read operation (see FIG. 12). A read voltage Vread is applied to the word line 710a connected to the selected memory cell 708a. The source line 728 is applied a 0 volt. The potential difference between the word line 710a and the source line 728 causes current to flow through the memory cell 708a if it is in a programmed state. This current (or the read voltage), in turn, turns on the read transistor 704 and causes current to flow through the read transistor 704, which would be sensed by a load or a sense and an on-state resistance of a mega-ohm ($10^6$) range which corresponds to an on-state current of micro-ampere ($10^{-6}$) range.

The program, erase, and read operations described above are performed by applying appropriate voltages to word lines, bit lines, select lines, and source lines according to an operation to be performed. Below is an operation table showing the voltages applied to the word lines, bit lines, select lines, and source lines with respect to the operation to be performed according to embodiments of the present invention.

TABLE 2

| Operation | | WL 1 (e.g., 710a) Selected | WL 2, 3 (e.g., 710b, 710c) | WLs in different WL groups (e.g., 712a-c, 714a-c) | Select line | Source line | BL Selected | BL Unselected |
|---|---|---|---|---|---|---|---|---|
| Program | Precharge | 1.5 V | 1.5 V | 0 V | 3 V (pulse) | 1.5 V | 0 V | 0 V |
| | Program cell 708a on 702b | 3 V | 1.5 V | 0 V | 3 V (pulse) | 0 V | 0 V | 0 V |
| | Inhibit cells on 702b | 3 V | 1.5 V | 0 V | 0 V | 0 V | 0 V | 0 V |
| Erase a bit | | 0 V | 1.5 V | 0 V | 4 V (pulse) | 3 V | 0 V | 0 V |
| Erase a page | | 0 V | 0 V | 0 V | 4 V (pulse) | 3 V | 0 V | 0 V |
| Read option 1 No precharge | | 0.5 V to 1.5 V | 0.5 V | 0 V | 0 V | 0 V | Sense Current | X |
| Read option 2 No precharge | | 0.5 V to 1.5 V | 0.5 V | 0 V | Vref~0.8 V | 0 V | Sense Current | X |
| Read option 3 | Precharge | 0.5 V | 0.5 V | 0 V | 3 V | 0.5 V | 1 V | X |
| | Read | 0.5 V to 1.5 V | 0.5 V | 0 V | 0 V | 0 V | Sense Voltage drop | X | circuitry (not shown) coupled to the bit line 718. The sense circuitry may be a current sensor or a voltage sensor according to implementation.

FIG. 13 illustrates a read operation according to yet another embodiment of the present invention. The precharge operation is performed before the read operation. The precharge voltage Vpc is applied to a word line WLsel, i.e., the word line 710a, for the select memory cell 708a and word lines WLunsel, i.e., 710b and 710c, for the unselected memory cells in the memory unit 702b. The precharge voltage Vpc is also applied to the source line 728. A first select voltage Vselect is applied to the select line 724 to turn on the program transistor 706. The memory cells 708a, 708b, and 708c in the memory unit 702b are thereby placed in a precharged state. The select voltage Vselect is set to zero from the select line 724 to turn off the program transistor 706. A read voltage Vread is applied to word line 710a, and the source line 728 is applied with a zero volt. The potential difference between the word line 710a and the source line 728 would cause a current to flow if the memory cell 708a is in a programmed state. This current (or the read voltage), would increase the gate voltage of the read transistor 704, thereby turning on the read transistor 704 and causing current to flow through the read transistor 704, which would be sensed by a load or a sense circuitry (not shown) coupled to the bit line 718. The sense circuitry may be a current sensor or a voltage sensor according to implementation.

Figure 14:
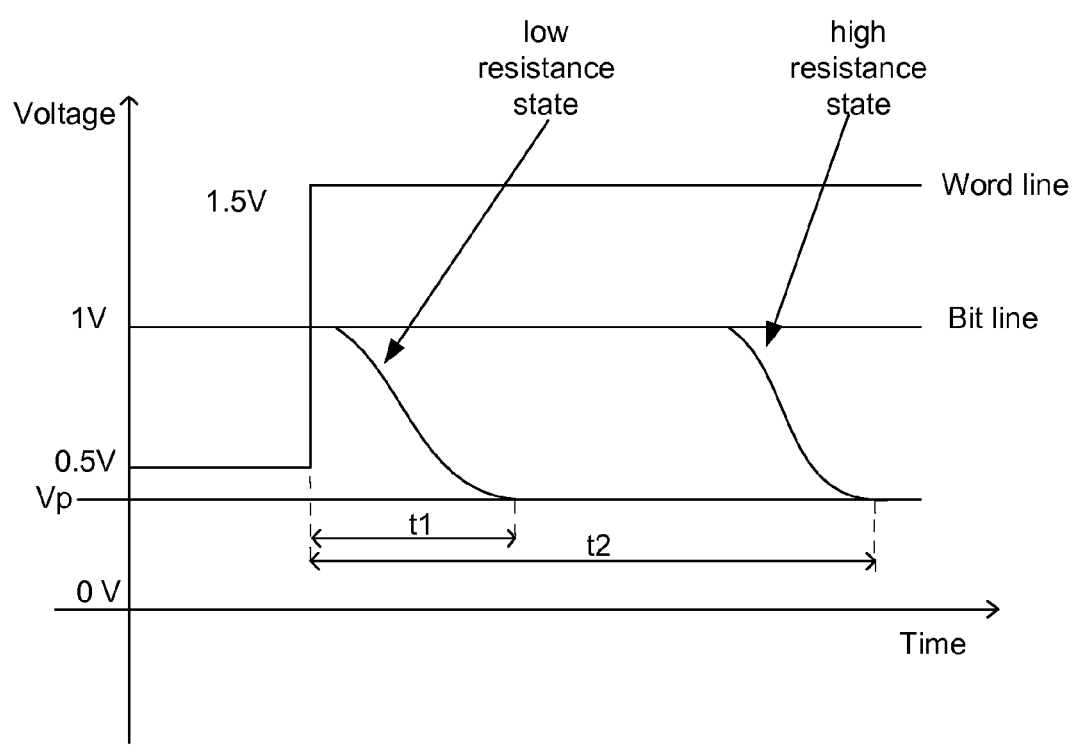
FIG. 14 illustrates a bit line sensing operation according to an embodiment of the present invention.

In an embodiment, a resistance state or a bit value of the selected memory cell, i.e., the resistive memory cell 708a, is determined by comparing the read current to a reference current. As noted, the memory cell can be characterized by an off-state resistance of a giga-ohm ($10^9$) range which corresponds to an off-state current of a nano-ampere ($10^{-9}$) range FIG. 14 illustrates a bit line sensing operation according to an embodiment of the present invention. In this embodiment, the resistance state of the memory device is determined by sensing the time elapsed for a voltage of the bit line 718 to drop to a predetermined value Vp. A memory cell in a low resistance state would take a first time period, e.g., t1, for the voltage drop. On the other hand, a memory cell in a high resistance state would take a second time period, e.g., t2, that is longer than the first time period for the voltage drop. The high resistance state can also be determined if the voltage drop does not occur at or after the time period t2.

A number of embodiments have been described. It will be understood that various modifications may be made without departing from the spirit and scope of the present invention. For example, the memory units may be provided with two-terminal memory cells other than resistive memory cells, e.g., phase-change memory (PCRAM), magnetoresistive random access memory (MRAM), and spin-transfer torque RAM (STT-RAM). The scope of the present invention should be defined using the appended claims.

What is claimed is:

1. A non-volatile memory device, comprising:
   a word line extending along a first direction;
   a bit line extending along a second direction; and
   a memory unit having a read transistor coupled to the bit line, at least one two-terminal memory cell, and a select transistor, the two-terminal memory cell having a first end coupled to the word line and a second end coupled to a gate electrode of the read transistor.

2. The device of claim 1, wherein the second end of the two-terminal memory cell is coupled to a common node shared by a drain electrode of the select transistor and the gate electrode of the read transistor.

3. The device of claim 2, wherein the device has a plurality of word lines, and wherein the memory unit has a plurality of two-terminal memory cells, each two-terminal memory cell having a first end coupled to one of the word lines and a second end coupled to the common node.

4. The device of claim 3, further comprising:
a source line coupled to a source electrode of the select transistor; and
a select line coupled to a gate electrode of the select transistor.

5. The device of claim 4, further comprising:
a plurality of word lines, the word line being one of the plurality of word lines, wherein the plurality of word lines have a first group of word lines, a second group of word lines, and a third word of word lines;
a plurality of memory units, the memory unit being one of the plurality of memory units, wherein the plurality of memory units have a first row of memory units, a second row of memory units, and a third row of memory units, and
wherein the first group of word lines is associated with the first row of memory units, the second group of word lines is associated with the second row of memory units, and the third group of word lines is associated with the third row of memory units.

6. The device of claim 5, wherein each memory unit includes a plurality of two-terminal memory cells, each memory cell in each memory unit having one end connected to one of the word lines and the other end connected to the common node.

7. The device of claim 6, wherein the two-terminal memory cells in each memory unit are configured to be accessed independently from other two-terminal memory cells in the same memory unit.

8. The device of claim 7, wherein each two-terminal memory cell includes a top electrode, a switching medium, and a bottom electrode, wherein the top electrode includes silver, the switching medium includes amorphous silicon, and the bottom electrode includes polysilicon.

9. The device of claim 8, wherein the two-terminal memory cell is a resistive memory cell configured to have a high resistance state and a low resistance state.

10. The device of claim 1, wherein the two-terminal memory cell includes one selected from the group consisting of: a resistive memory cell, a phase-change memory (PCRAM) cell, a magnetoresistive random access memory (MRAM) cell, and a spin-transfer torque RAM (STT-RAM) cell.

11. The device of claim 1, further comprising:
a source line coupled to a source electrode of the select transistor; and
a select line coupled to a gate electrode of the select transistor,
wherein the second end of the two-terminal memory cell is coupled to a common node shared by a drain electrode of the select transistor and the gate electrode of the read transistor,
wherein the device has a plurality of word lines, and wherein the memory unit has a plurality of two-terminal memory cells, each two-terminal memory cell having a first end coupled to one of the word lines and a second end coupled to the common node, and
wherein each two-terminal memory cell includes a switching medium provided between the first and second ends, wherein the first end includes silver, the switching medium includes amorphous silicon, and the second end includes poly silicon.

12. A non-volatile memory device, comprising:
a plurality of memory units arranged in an array of rows and columns, the each memory unit having a plurality of resistive memory cells, each resistive memory cell having a first end and a second end;
a plurality of word lines extending along a first direction and having a first group of word lines associated with a first row of memory units, a second group of word lines associated with a second row of memory units, and a third group of word lines associated with a third row of memory units;
a plurality of bit lines extending along a second direction and having a first bit line associated with a first column of memory units, a second bit line associated with a second column of memory units, and a third bit line associated with a third column of memory units;
a plurality of read transistors, each read transistor being associated with one of the memory units and having a drain electrode coupled to one of the bit lines;
a plurality of select transistors, each select transistor being associated with one of the memory units;
a plurality of select lines having a first select line coupled to gate electrodes of the select transistors associated with the first column of memory units, a second select line coupled to gate electrodes of the select transistors associated the second column of memory units, and a third select line coupled to gate electrodes of the select transistors associated with the third column of memory units;
a plurality of source lines having a first source line coupled to source electrodes of select transistors associated with the first row of memory units, a second source line coupled to source electrodes of select transistors associated with the second row of memory units, and a third source line coupled to source electrodes of select transistors associated with the third row of memory units; and
wherein the first terminals of the resistive memory cells are coupled to the corresponding word lines and the second terminals of the resistive memory cells are coupled to corresponding common nodes, each common node being shared by the drain electrode of one of the select transistor and the gate electrode of the corresponding read transistor.

13. The device of claim 12, wherein each memory unit includes at least eight resistive memory cells.

14. The device of claim 12, wherein each of the resistive memory cells is configured to have at least a high resistance state and a low resistance state.

15. The device of claim 12, wherein the first group of word lines, the second group word lines, and the third group of word lines each has the same number of word lines as the number of resistive memory cells in each memory unit.

16. The device of claim 12, wherein the source lines extend along the first direction, and the select lines extend along the second direction.

17. The device of claim 16, wherein each memory unit is provided within a space defined by a corresponding group of word lines, a corresponding source line, a corresponding select line, and a corresponding bit line.

18. The device of claim 16, wherein the resistive memory cells in each memory unit are configured to be accessed independently from other resistive memory cells in the same memory unit.

19. The device of claim 18, wherein each resistive memory cell includes a switching medium provided between the first and second terminals, and wherein the first terminal includes silver, the switching medium includes amorphous silicon, and the second terminal includes polysilicon.

20. A memory unit of a memory device, the memory unit comprising:
   a plurality of resistive memory cells;
   a select transistor having a drain electrode coupled to a common node, a gate electrode coupled to a select line, and a source electrode coupled to a source line;
   a read transistor having a drain electrode coupled to a bit line and a gate electrode coupled to the common node, and
   wherein each resistive memory cell has a first end coupled to a word line and a second end coupled to the common node, and a switching medium provided between the first and second ends.

21. The memory unit of claim 20, wherein each resistive memory cell is configured to be accessed independently from other resistive memory cells of the memory unit.

22. The memory unit of claim 21, wherein the memory unit is provided as part of an array of memory units arranged in rows and columns in the memory device.

23. The memory unit of claim 22, wherein the first terminal includes silver, the switching medium includes amorphous silicon, and the second terminal includes poly silicon.

24. A method for operating a memory device, the method comprising:
   providing a memory unit having
      a plurality of resistive memory cells,
      a select transistor having a drain electrode coupled to a common node, a gate electrode coupled to a select line, and a source electrode coupled to a source line,
      a read transistor having a drain electrode coupled to a bit line and a gate electrode coupled to the common node, wherein each resistive memory cell has a first end coupled to a word line and a second end coupled to the common node, and
      a switching medium provided between the first and second ends;
   selecting at least one resistive memory cell from the plurality of the resistive memory cells; and
   applying a first potential to the word line associated with the selected memory cell with respect to the common node.

25. The method of claim 24, wherein the first potential is a positive potential.

26. The method of claim 25, wherein the first potential corresponds to a program voltage that is sufficient to change a resistive state of the selected memory cell.

27. The method of claim 26, further comprising:
   applying the program voltage to the word line associated with the selected memory cell; and
   applying a select voltage to the gate electrode of the select transistor to turn on the select transistor.

28. The method of claim 27, wherein the programming voltage is provided in a form of one or more voltage pulses.

29. The method of claim 27, wherein the first potential is no more than 3 volts.

30. The method of claim 27, further comprising:
   applying a first precharge voltage to a plurality of word lines associated with the memory units, the plurality of word lines including the word line associated with the selected memory cell;
   applying the select voltage to the gate electrode of the select transistor; and
   applying a second precharge voltage to the source line.

31. The method of claim 30, wherein the first precharge and the second precharge voltages are about 1.5 volt.

32. The method of claim 30, further comprising:
   lowering a potential of the source line with respect to the ground to a second potential by stop applying the second precharge to the source line during a program operation; and
   increasing a potential of the word line associated with the selected memory cell with respect to the common node to a third potential during the program operation.

33. The method of claim 32, wherein the second potential is no more than 1.5 volt, and the third potential is about 3 volts.

34. The method of claim 33, wherein the first potential is substantially the same as the third potential.

35. The method of claim 24, wherein the first potential corresponds to a read voltage sufficient to cause electrical current to flow through the selected resistive memory cell if the selected resistive memory cell is in a low resistive state, the read voltage not being sufficient to change a resistive state of the selected memory cell.

36. The method of claim 35, wherein the electrical current flowing through the select resistive memory cell increases a voltage being applied to the gate electrode of the read transistor, thereby turning on the read transistor and causing electrical current to flow through the read transistor.

37. The method of claim 36, the selected resistive memory cell is determined to be in a programmed state or an erased state according to a potential drop of the bit line coupled to the read transistor.

38. The method of claim 35, wherein the read voltage is no more than 1.5 volt.

39. The method of claim 24, wherein the first potential is a negative potential.

40. The method of claim 39, further comprising:
   applying an erase voltage to the source line;
   applying about 0 volt to the word line associated with the selected memory cell; and
   applying a select voltage to the gate electrode of the select transistor to turn on the select transistor.

41. The method of claim 40, wherein about 0 volt is applied to a plurality of word lines associated with the memory units so that all the resistive memory cells in the memory unit are erased together, the plurality of word lines including the word line associated with the selected memory cell.

42. The method of claim 40, wherein an inhibit voltage is applied to a plurality of word lines associated with the memory units so that only the selected memory cell is erased in the memory unit, the plurality of word lines including the word line associated with the selected memory cell.

43. The method of claim 40, wherein the erase voltage is applied in a form of one or more voltage pulses.

* * * * *